(12) United States Patent
Shimizu et al.

(10) Patent No.: US 8,518,297 B2
(45) Date of Patent: Aug. 27, 2013

(54) POLISHING COMPOSITION AND POLISHING METHOD USING THE SAME

(75) Inventors: Mikikazu Shimizu, Komaki (JP); Tomohiko Akatsuka, Inchinomiya (JP); Kazuya Sumita, Kakamigahara (JP)

(73) Assignee: Fujimi Incorporated, Kiyosu-Shi (JP)

( * ) Notice: Subject to any disclaimer, the term of this patent is extended or adjusted under 35 U.S.C. 154(b) by 815 days.

(21) Appl. No.: 12/362,991

(22) Filed: Jan. 30, 2009

(65) Prior Publication Data

US 2009/0197413 A1  Aug. 6, 2009

(30) Foreign Application Priority Data

Feb. 1, 2008  (JP) .................................. 2008-023226

(51) Int. Cl.
*C09K 13/06*  (2006.01)

(52) U.S. Cl.
USPC ............. 252/79.4; 252/79.1; 216/53; 216/88; 216/89; 216/90; 216/91; 438/689; 438/690; 438/691; 438/692; 438/693; 257/E21.23

(58) Field of Classification Search
None
See application file for complete search history.

(56) References Cited

U.S. PATENT DOCUMENTS

| | | | |
|---|---|---|---|
| 3,715,842 A | 2/1973 | Tredinnick et al. | |
| 4,169,337 A | 10/1979 | Payne | |
| 4,462,188 A | 7/1984 | Payne | |
| 4,588,421 A | 5/1986 | Payne | |
| 5,230,833 A | 7/1993 | Rombergere et al. | |
| 5,352,277 A | 10/1994 | Sasaki | |
| 5,916,819 A | 6/1999 | Skrovan et al. | |
| 6,099,604 A | 8/2000 | Sandhu et al. | |
| 6,454,820 B2 | 9/2002 | Hagihara et al. | |
| 7,314,578 B2 | 1/2008 | Choi et al. | |
| 2004/0148867 A1* | 8/2004 | Matsumi | 51/298 |
| 2005/0205837 A1* | 9/2005 | Miwa | 252/79.1 |
| 2007/0051638 A1* | 3/2007 | Sato et al. | 205/662 |
| 2007/0128872 A1* | 6/2007 | Itoh et al. | 438/691 |
| 2008/0032505 A1* | 2/2008 | Kawamura et al. | 438/692 |
| 2008/0121839 A1* | 5/2008 | Park et al. | 252/79.1 |

FOREIGN PATENT DOCUMENTS

| | | | |
|---|---|---|---|
| JP | 4-291723 A1 | | 10/1992 |
| JP | 10-168431 A1 | | 6/1998 |
| JP | 2001185514 | | 7/2001 |
| JP | 2001-237203 | * | 8/2001 |
| JP | 2001308043 | | 11/2001 |
| JP | 2004297035 | | 10/2004 |
| JP | 2007-073548 A | | 3/2007 |
| JP | 2007-144612 | * | 6/2007 |
| JP | 2008182181 | | 8/2008 |

* cited by examiner

*Primary Examiner* — Lan Vinh
*Assistant Examiner* — Jiong-Ping Lu
(74) *Attorney, Agent, or Firm* — Vidas, Arrett & Steinkraus, P.A.

(57) ABSTRACT

The present invention provides a polishing composition that can be suitably used in polishing of polysilicon, and a polishing method using the polishing composition. The polishing composition contains abrasive grains and an anionic surfactant having a monooxyethylene group or a polyoxyethylene group and has a pH of 9 to 12. If the anionic surfactant contained in the polishing composition has a polyoxyethylene group, the number of repeating oxyethylene units in the polyoxyethylene group is preferably 2 to 8. The anionic surfactant contained in the polishing composition can be an anionic surfactant that has a phosphate group, a carboxy group, or a sulfo group as well as a monooxyethylene group or a polyoxyethylene group. The content of the anionic surfactant in the polishing composition is preferably 20 to 500 ppm.

9 Claims, No Drawings

POLISHING COMPOSITION AND POLISHING METHOD USING THE SAME

BACKGROUND OF THE INVENTION

The present invention relates to a polishing composition used mainly in polishing of polysilicon and to a polishing method using the polishing composition.

In semiconductor device manufacturing processes, for example, polishing may be conducted to remove part of polysilicon film formed on substrates. In this polishing, it is not only desirable to remove polysilicon at high rate, but it is also important to minimize the occurrence of dishing that reduces the flatness of the surface of polished polysilicon film. Dishing refers to a phenomenon in which after part of polysilicon film not to be removed is polished and removed, depressions are formed on the surface of the polished polysilicon film. Many of the previously known polishing compositions cannot be practically used because they do not meet the performance requirements for polysilicon removal rate and dishing sufficiently.

Examples of a document relating to the present invention include Japanese Laid-Open Patent Publication Nos. 10-168431 and 4-291723.

SUMMARY OF THE INVENTION

An objective of the present invention is to provide a polishing composition that can be suitably used in polishing of polysilicon, and a polishing method using the polishing composition.

In accordance with a first aspect of the present invention, a polishing composition is provided. The polishing composition contains abrasive grains and an anionic surfactant having a monooxyethylene group or a polyoxyethylene group. The pH of the polishing composition is 9 to 12.

In accordance with a second aspect of the present invention, a polishing method is provided. The polishing method includes: preparing a polishing composition according to the first aspect; and polishing polysilicon by using the polishing composition.

Other aspects and advantages of the invention will become apparent from the following description, illustrating by way of example the principles of the invention.

DETAILED DESCRIPTION OF THE PREFERRED EMBODIMENTS

A description of one embodiment of the present invention is given below.

A polishing composition according to the present embodiment is manufactured by mixing an anionic surfactant and abrasive grains into water, along with a pH adjuster as needed, so that the pH of the polishing composition falls into the range of 9 to 12. For this reason, the polishing composition contains an anionic surfactant, abrasive grains, and water, and further contains a pH adjuster as needed.

The polishing composition of the present embodiment is mainly used in polishing of polysilicon, more specifically in polishing conducted to remove part of polysilicon film Wormed on substrates such as single-crystal silicon substrates.

It is essential that the anionic surfactant contained in the polishing composition has a monooxyethylene group or a polyoxyethylene group to reduce the occurrence of dishing on the surface of the polysilicon film polished by using the polishing composition to a level that is practically acceptable. Examples of such an anionic surfactant include polyoxyethylene alkyl ether phosphate, polyoxyethylene alkyl ether acetate, and polyoxyethylene alkyl ether sulfate. In other words, any anionic surfactant that has a phosphate group, a carboxy group, or a sulfo group as well as a monooxyethylene group or a polyoxyethylene group can be used. If the anionic surfactant contained in the polishing composition has a polyoxyethylene group, the number of repeating oxyethylene units in the polyoxyethylene group is preferably 2 to 8.

The content of the anionic surfactant in the polishing composition is preferably 20 ppm or more. As the content of the anionic surfactant increases, the occurrence of dishing on the surface of the polysilicon film polished by using the polishing composition is reduced more. In this respect, if the content of the anionic surfactant in the polishing composition is 20 ppm or more, it is easy to reduce the occurrence of dishing on the surface of the polished polysilicon film to a level particularly suitable for practical use.

In addition, the content of the anionic surfactant in the polishing composition is preferably 500 ppm or less. As the content of the anionic surfactant decreases, the rate of removal of polysilicon by the polishing composition increases. In this respect, if the content of the anionic surfactant in the polishing composition is 500 ppm or less, it is easy to obtain a rate of removal of polysilicon by the polishing composition that is at a level particularly suitable for practical use.

Examples of the abrasive grains contained in the polishing composition include colloidal silica, fumed silica, and powdered calcined silica, and among them colloidal silica is preferable. When colloidal silica is used, the occurrence of dishing on the surface of the polysilicon film polished by using the polishing composition is reduced more greatly than when other abrasive grains are used.

The content of the abrasive grains in the polishing composition is preferably 0.1% by mass or more, more preferably 0.3% by mass or more, and even more preferably 1.0% by mass or more. As the content of the abrasive grains increases, the rate of removal of polysilicon by the polishing composition increases. In this respect, if the content of the abrasive grains in the polishing composition is 0.1% by mass or more, more specifically 0.3% by mass or more, or even more specifically 1.0% by mass or more, it is easy to increase the rate of removal of polysilicon by the polishing composition to a level particularly suitable for practical use.

In addition, the content of the abrasive grains in the polishing composition is preferably 15% by mass or less, more preferably 10% by mass or less, and even more preferably 5.0% by mass or less. As the content of the abrasive grains decreases, the dispersion of the abrasive grains in the polishing composition increases. In this respect, if the content of the abrasive grains in the polishing composition is 15% by mass or less, more specifically 10% by mass or less, or even more specifically 5.0% by mass or less, it is easy to increase the dispersion of the abrasive grains in the polishing composition to a level particularly suitable for practical use.

The average primary particle diameter of the abrasive grains contained in the polishing composition is preferably 3 nm or more, more preferably 5 nm or more, and even more preferably 10 nm or more. As the average primary particle diameter of the abrasive grains increases, the rate of removal of polysilicon by the polishing composition increases. In this respect, if the average primary particle diameter of the abrasive grains is 3 nm or more, more specifically 5 nm or more, or even more specifically 10 nm or more, it is easy to increase the rate of removal of polysilicon by the polishing composition to a level particularly suitable for practical use.

In addition, the average primary particle diameter of the abrasive grains contained in the polishing composition is preferably 200 nm or less, more preferably 150 nm or less, and even more preferably 90 nm or less. As the average primary particle diameter of the abrasive grains decreases, the dispersion of the abrasive grains in the polishing composition increases. In this respect, if the average primary particle diameter of the abrasive grains is 200 nm or less, more specifically 150 nm or less, or even more specifically 90 nm or less, it is easy to increase the dispersion of the abrasive grains in the polishing composition to a level particularly suitable for practical use.

The pH adjuster contained in the polishing composition as needed is not particularly limited, and any alkali can be used in appropriate amounts to adjust the pH of the polishing composition to a desired value between 9 and 12. Examples of an alkali that can be used as the pH adjuster include tetramethylammonium hydroxide, ethylamine, and ethanolamine.

The present embodiment provides the following advantages.

If polysilicon film is polished by using the polishing composition of the present embodiment, a high rate of removal of polysilicon is obtained and at the same time the occurrence of dishing on the surface of the polished polysilicon film is reduced greatly. Therefore, the polishing composition is used suitably in polishing of polysilicon, particularly in polishing conducted to remove part of polysilicon film formed on substrates. The reason why the advantages mentioned above are obtained by using the polishing composition of the present embodiment is not understood in detail, but it is estimated that the advantages are brought about by the modification of the surface of the polysilicon film by the anionic surfactant contained in the polishing composition.

The embodiment may be modified as follows.

The polishing composition of the embodiment may contain two or more types of anionic surfactants having a monooxyethylene group or a polyoxyethylene group.

The polishing composition of the embodiment may contain two or more types of abrasive grains.

Additives such as chelating agents, water-soluble polymers, surfactants other than anionic surfactants having a monooxyethylene group or a polyoxyethylene group, antiseptics, fungicides, and rust preventives may be added to the polishing composition of the embodiment as needed.

The polishing composition of the embodiment may be prepared by diluting the stock solution of the polishing composition with water.

Next, the present invention is described more specifically by using Examples and Comparative Examples.

In Examples 1 to 24 and Comparative Examples 1 and 2, polishing compositions were prepared by adding a pH adjuster and water and further an anionic surfactant to abrasive grains. The anionic surfactant used here was a specific anionic surfactant having a monooxyethylene group or a polyoxyethylene group. In Comparative Examples 3 to 6, polishing compositions were prepared by adding a pH adjuster and water and further a compound as an alternative to the specific anionic surfactant to abrasive grains. Table 1 shows details of the anionic surfactant or its alternative and the abrasive grains contained in each polishing composition as well as the results of the pH measurement of each polishing composition. The pH adjuster used for each polishing composition is tetramethylammonium hydroxide.

In Table 1,

A1 indicates colloidal silica having an average primary particle diameter of 10 nm, A2 indicates colloidal silica having an average primary particle diameter of 30 nm, A3 indicates colloidal silica having an average primary particle diameter of 70 nm, A4 indicates colloidal silica having an average primary particle diameter of 90 nm, A5 indicates colloidal silica having an average primary particle diameter of 130 nm, B1 indicates dipolyoxyethylene alkyl ether phosphate as shown by structural formula (1) below (m=6), B2 indicates dipolyoxyethylene alkyl ether phosphate as shown by structural formula (1) below (m=2), B3 indicates dipolyoxyethylene alkyl ether phosphate as shown by structural formula (1) below (m=4), C1 indicates monopolyoxyethylene alkyl ether acetate as shown by structural formula (2) below (m=3), C2 indicates monopolyoxyethylene alkyl ether acetate as shown by structural formula (2) below (m=7), D1 indicates tripolyoxyethylene alkyl ether phosphate as shown by structural formula (3) below (m=6), D2 indicates tripolyoxyethylene alkyl ether phosphate as shown by structural formula (3) below (m=8), E indicates monopolyoxyethylene alkyl ether sulfate as shown by structural formula (4) below (m=3), F indicates hydroxyethyl cellulose having a mean molecular weight of about 1,200,000 as shown by structural formula (5) below (m=2 to 3), G indicates polyoxyethylene polyoxypropylene glycol as shown by structural formula (6) below (m1+m2=25, n=30), H indicates alkyl sulfate as shown by structural formula (7) below, and J indicates alkylbenzene sulfonate as shown by structural formula (8) below.

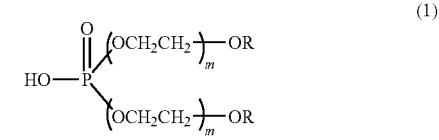

(1)

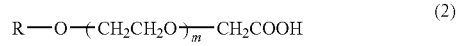

(2)

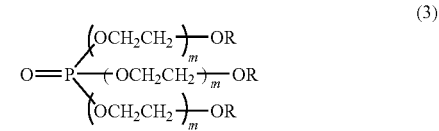

(3)

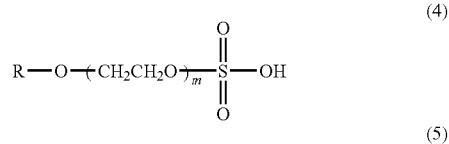

(4)

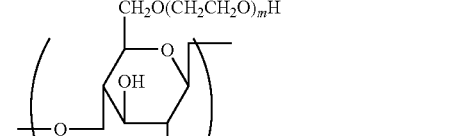

(5)

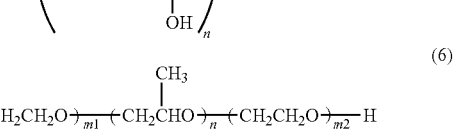

(6)

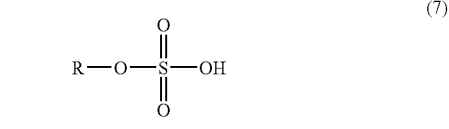

(7)

-continued

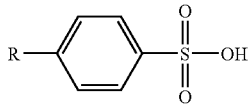

(8)

The polysilicon removal rate measured when the surface of a polysilicon film blanket wafer having a diameter of 200 mm was polished by using each polishing composition under the conditions shown in Table 2 is entered in the "Polysilicon removal rate" field in Table 1. The polysilicon removal rate value was determined by dividing the difference between the thickness of each substrate before polishing and that after polishing by polishing time (60 seconds). The thickness of each substrate before polishing and that after polishing were measured by using LAMBDA ACE VM-2030, an optical interferometric film thickness measurement system manufactured by DAINIPPON SCREEN MFG. CO., LTD.

The amount of dishing (depth of a depression formed by dishing) measured after when the surface of a polysilicon film patterned wafer having a diameter of 200 mm was polished by using each polishing composition under the conditions shown in Table 2 is entered in the "Amount of dishing" field in Table 1. After an endpoint signal was detected, the polysilicon film patterned wafer was further polished for a time corresponding to 40% of the polishing time taken to detect the endpoint signal before completion of the polishing.

TABLE 2

Polisher: "Mirra" manufactured by Applied Materials, Inc
Platen diameter: 380 mm
Polishing pad: "IC-1010 M-Groove" manufactured by Rohm and Haas Company
Polishing pressure: approximately 14 kPa (=20 psi)
Rotation speed of machine platen: 63 rpm
Rotation speed of head: 57 rpm
Feeding rate of polishing composition: 200 mL/min
Dressing: In-situ (#100 diamond dresser used)

As shown in Table 1, the polishing compositions according to Examples 1 to 24 provided a polysilicon removal rate of 500 Å/min or more, which is practically acceptable, and an amount of dishing of 700 Å or less, which is practically acceptable. In contrast, the polishing compositions according to Comparative Examples 1 to 2 whose pH went beyond the range of 9 to 12 provided a polysilicon removal Kate of less than 500 Å/min, which is not practically acceptable. In addition, the polishing compositions according to Comparative Examples 3 to 6 that did not contain the specific anionic surfactant provided an amount of dishing of more than 700 Å, which is not practically acceptable.

The invention claimed is:

1. A polishing composition comprising abrasive grains and an anionic surfactant having a polyoxyethylene group in which the number of repeating oxyethylene units is 2 to 8, wherein the anionic surfactant is polyoxyethylene alkyl ether phosphate, and wherein the polishing composition has a pH of 10.2 to 12.

TABLE 1

| | Abrasive grains | | Anionic surfactant or alternative compound | | | Polysilicon removal rate | Amount of dishing |
|---|---|---|---|---|---|---|---|
| | Type | Content (% by mass) | Type | Content (ppm) | pH | (Å/min) | (Å) |
| Example 1 | A1 | 2.5 | B1 | 50 | 10.2 | 1442 | 590 |
| Example 2 | A2 | 2.5 | B1 | 50 | 10.2 | 1521 | 510 |
| Example 3 | A3 | 2.5 | B1 | 50 | 10.2 | 1460 | 555 |
| Example 4 | A4 | 2.5 | B1 | 50 | 10.2 | 1340 | 480 |
| Example 5 | A5 | 2.5 | B1 | 50 | 10.2 | 1292 | 533 |
| Example 6 | A4 | 1.0 | B1 | 70 | 10.2 | 877 | 490 |
| Example 7 | A4 | 2.5 | B1 | 70 | 10.2 | 1247 | 355 |
| Example 8 | A4 | 5.0 | B1 | 70 | 10.2 | 1270 | 387 |
| Example 9 | A4 | 7.5 | B1 | 70 | 10.2 | 1306 | 455 |
| Comparative Example 1 | A4 | 2.5 | B1 | 50 | 8.0 | 455 | 611 |
| Example 10 | A4 | 2.5 | B1 | 50 | 9.0 | 912 | 644 |
| Example 11 | A4 | 2.5 | B1 | 50 | 10.2 | 1340 | 480 |
| Example 12 | A4 | 2.5 | B1 | 50 | 11.0 | 1088 | 594 |
| Example 13 | A4 | 2.5 | B1 | 50 | 12.0 | 1192 | 677 |
| Comparative Example 2 | A4 | 2.5 | B1 | 50 | 13.0 | 322 | 887 |
| Example 14 | A4 | 2.5 | C1 | 200 | 10.2 | 824 | 689 |
| Example 15 | A4 | 2.5 | C2 | 50 | 10.2 | 815 | 681 |
| Example 16 | A4 | 2.5 | D1 | 70 | 10.2 | 1589 | 492 |
| Example 17 | A4 | 2.5 | D2 | 60 | 10.2 | 1108 | 396 |
| Example 18 | A4 | 2.5 | E | 80 | 10.2 | 1353 | 677 |
| Example 19 | A4 | 2.5 | B2 | 100 | 10.2 | 1262 | 615 |
| Example 20 | A4 | 2.5 | B3 | 80 | 10.2 | 1316 | 508 |
| Comparative Example 3 | A4 | 2.5 | F | 50 | 10.2 | 1457 | 720 |
| Comparative Example 4 | A4 | 2.5 | G | 50 | 10.2 | 1521 | 734 |
| Comparative Example 5 | A4 | 2.5 | H | 150 | 10.2 | 1504 | 1115 |
| Comparative Example 6 | A4 | 2.5 | J | 120 | 10.2 | 1395 | 922 |
| Example 21 | A4 | 2.5 | B1 | 20 | 10.2 | 1766 | 603 |
| Example 22 | A4 | 2.5 | B1 | 70 | 10.2 | 1247 | 355 |
| Example 23 | A4 | 2.5 | B1 | 100 | 10.2 | 1009 | 437 |
| Example 24 | A4 | 2.5 | B1 | 500 | 10.2 | 731 | 512 |

2. The polishing composition according to claim 1, wherein the anionic surfactant is contained in the polishing composition in an amount of 20 to 500 ppm.

3. The polishing composition according to claim 1, wherein the abrasive grains are colloidal silica.

4. The polishing composition according to claim 1, wherein the average primary particle diameter of the abrasive grains is 10 to 90 nm.

5. The polishing composition according to claim 1, wherein the abrasive grains are contained in the polishing composition in an amount of 1.0 to 5.0% by mass.

6. The polishing composition according to claim 1, wherein the polyoxyethylene group is one of a plurality of polyoxyethylene groups, and the anionic surfactant has the plurality of polyoxyethylene groups.

7. The polishing composition according to claim 6, wherein the anionic surfactant is dipolyoxyethylene alkyl ether phosphate.

8. The polishing composition according to claim 6, wherein the anionic surfactant is tripolyoxyethylene alkyl ether phosphate.

9. A polishing method comprising:
preparing a polishing composition containing abrasive grains and an anionic surfactant having a polyoxyethylene group in which the number of repeating oxyethylene units is 2 to 8, wherein the anionic surfactant is polyoxyethylene alkyl ether phosphate, and wherein the polishing composition has a pH of 10.2 to 12; and
polishing polysilicon by using the polishing composition.

* * * * *